(12) United States Patent
Shu (10) Patent No.: US 12,068,247 B2
(45) Date of Patent: Aug. 20, 2024

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventor: Yuejiao Shu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 414 days.

(21) Appl. No.: 17/467,603

(22) Filed: Sep. 7, 2021

(65) Prior Publication Data

US 2022/0059447 A1   Feb. 24, 2022

Related U.S. Application Data

(63) Continuation of application No. PCT/CN2021/103670, filed on Jun. 30, 2021.

(30) Foreign Application Priority Data

Aug. 21, 2020   (CN) .......................... 202010847669.X (51) Int. Cl.
  *H01L 23/528*   (2006.01)
  *H01L 21/768*   (2006.01)

(52) U.S. Cl.
  CPC ...... *H01L 23/528* (2013.01); *H01L 21/76802* (2013.01); *H01L 21/76877* (2013.01)

(58) Field of Classification Search
  CPC ............. H01L 23/528; H01L 21/76802; H01L 21/76877; H01L 21/76805;
(Continued)

(56) References Cited

U.S. PATENT DOCUMENTS 6,828,219 B2   12/2004  Yang
9,006,078 B2    4/2015  Kim
(Continued)

FOREIGN PATENT DOCUMENTS

CN   108389861 A   8/2018
CN   110061001 A   7/2019
CN   110299360 A   10/2019

*Primary Examiner* — Mohammad A Rahman
(74) *Attorney, Agent, or Firm* — Kilpatrick Townsend & Stockton LLP (57) ABSTRACT

A method for manufacturing a semiconductor structure includes: a substrate is provided, the substrate is provided with memory cell array region and peripheral circuit region; a first insulating dielectric layer is formed in memory cell array region and a second insulating dielectric layer is formed in peripheral circuit region, bit line structures are formed in first insulating dielectric layer, conductive structures are formed in second insulating dielectric layer, each bit line structure includes a bit line conductive structure and an isolation structure covering a top and a side wall of bit line conductive structure; isolation structure is etched to form a first gap in memory cell array region and second insulating dielectric layer between conductive structures is etched to form a second gap in peripheral circuit region; and a third insulating dielectric layer is formed on a side wall of first gap and a side wall of second gap.

9 Claims, 6 Drawing Sheets

(58) Field of Classification Search
CPC ......... H01L 21/76831; H01L 21/76897; H01L 27/108; H10B 12/09; H10B 12/482
See application file for complete search history.

(56) References Cited

U.S. PATENT DOCUMENTS

| | | |
|---|---|---|
| 9,318,382 B2 | 4/2016 | Kim |
| 9,627,252 B2 | 4/2017 | Kim |
| 10,186,513 B2 | 1/2019 | Chang et al. |
| 10,529,719 B2 | 1/2020 | Wu et al. |
| 10,770,464 B2 | 9/2020 | Liu et al. |
| 10,825,818 B2 | 11/2020 | Chang et al. |
| 2003/0178688 A1 | 9/2003 | Yang |
| 2014/0306351 A1 | 10/2014 | Kim |
| 2015/0187644 A1 | 7/2015 | Kim |
| 2016/0197003 A1 | 7/2016 | Kim |
| 2018/0226410 A1 | 8/2018 | Chang et al. |
| 2019/0109138 A1 | 4/2019 | Chang et al. |
| 2019/0221570 A1* | 7/2019 | Liu ..................... H10B 12/482 |
| 2019/0296019 A1 | 9/2019 | Wu et al. |
| 2020/0105763 A1 | 4/2020 | Wu et al. |

\* cited by examiner

SEMICONDUCTOR STRUCTURE AND METHOD FOR MANUFACTURING SEMICONDUCTOR STRUCTURE

CROSS-REFERENCE TO RELATED APPLICATION

This application is a continuation application of International Patent Application No. PCT/CN2021/103670, filed on Jun. 30, 2021 and entitled "Semiconductor Structure and Method for Manufacturing Semiconductor Structure", which claims priority to Chinese patent application No. 202010847669.X, filed to the China National Intellectual Property Administration on Aug. 21, 2020 and entitled "Semiconductor Structure and Method for Manufacturing Semiconductor Structure". The contents of International Patent Application No. PCT/CN2021/103670 and Chinese Patent Application No. 202010847669.X are hereby incorporated by reference in their entireties.

TECHNICAL FIELD

The application relates to the technical field of semiconductor memory devices, and in particular relates to a semiconductor structure and a method for manufacturing a semiconductor structure.

BACKGROUND

With the development of dimension miniaturization of a semiconductor memory device, the dimension of transistors in a memory cell array region and a peripheral circuit region is getting smaller and smaller, which results in that the demand for an overlay error is higher and higher, and leads to approaching the limit of overlay error control. One purpose of a peripheral circuit contact connection process is to connect a metal layer with an active region by digging a hole, but the distance between Periphery Gates (PGs) in the peripheral circuit region is relatively short, and if the active region is desired to be connected between two PGs through a Periphery Contact (PC) process and not short-circuited with a gate of the transistor in the peripheral circuit region, the demand for the overlay error is very high. Moreover, another purpose of the PC is to connect a bit line (BL), but because the dimension of the BL is too small, and the key dimension of a W part of the metal layer serving as a main body is about 11 nm, a side wall of the BL will be seriously damaged during an etching process of PC on BL.

SUMMARY

According to various embodiments of the application, a semiconductor structure and a method for manufacturing a semiconductor structure are provided.

The application provides a method for manufacturing a semiconductor structure, including the following operations.

A substrate is provided, where the substrate is provided with a memory cell array region and a peripheral circuit region.

A first insulating dielectric layer is formed in the memory cell array region and a second insulating dielectric layer is formed in the peripheral circuit region, Bit line structures spaced apart from each other are formed in the first insulating dielectric layer, and conductive structures spaced apart from each other are formed in the second insulating dielectric layer. Each bit line structure includes a bit line conductive structure and an isolation structure covering a top and a side wall of the bit line conductive structure.

The isolation structure is etched to form a first gap in the memory cell array region and the second insulating dielectric layer between the conductive structures in the peripheral circuit region is etched to form a second gap in the peripheral circuit region. The first gap at least partly exposes the bit line conductive structures, and the second gap exposes the substrate between the conductive structures in the peripheral circuit region.

A third insulating dielectric layer is formed on a side wall of the first gap and a side wall of the second gap. A thickness of the third insulating dielectric layer on the side wall of the first gap and a thickness of the isolation structure on a side wall of each bit line structure are the same or different from each other.

The embodiment of the application further provides a semiconductor structure, including a substrate and a bit line structure.

The substrate is provided with a memory cell array region, and a first insulating dielectric layer is formed on the substrate in the memory cell array region.

The bit line structure is formed in the first insulating dielectric layer, and includes a bit line conductive structure and an isolation structure located on a side wall of the bit line conductive structure. The bit line conductive structure includes a first conductive structure and a second conductive structure connected with a top of the first conductive structure. The isolation structure includes a first bit line isolation structure and a second bit line isolation structure located above the first bit line isolation structure. A thickness of the first bit line isolation structure and a thickness of the second bit line isolation structure on the side wall of the bit line conductive structure are the same or different from each other.

BRIEF DESCRIPTION OF THE DRAWINGS

In order to describe the technical solutions in the embodiments of the application or a related art more clearly, the drawings required to be used in descriptions about the embodiments or the related art will be simply introduced below. It is apparent that the drawings described below are only some embodiments of the application. Other drawings may further be obtained by those of ordinary skilled in the art according to these drawings without creative work.

Reference numerals: substrate—100, bit line structure—200, bit line conductive structure/conductive structure/first conductive structure—210, second conductive structure—230, first conductive layer—2101, second conductive layer—2102, isolation structure—220, first bit line isolation structure—2201, second bit line isolation structure—2202, third isolation structure—2203, second conductive structure—230, first insulating dielectric layer—310, second insulating dielectric layer—320, third insulating material layer—400a, third insulating dielectric layer—400, first connection structure—510, first gap—510a, second connection structure—520, and second gap—520a.

DETAILED DESCRIPTION

In order to make the application convenient to understand, the application will be described more comprehensively below with reference to the related drawings. The drawings show embodiments of the application. However, the application may be implemented in various forms and is not limited to the embodiments described herein. On the contrary, these embodiments are provided to make the contents disclosed in the application understood more thoroughly and comprehensively.

Unless otherwise defined, all technical and scientific terms used herein have the same meanings as commonly understood by those skilled in the art that the application belongs to. Herein, terms used in the description of the application are only for the purpose of describing specific embodiments and not intended to limit the application.

Figure 1:
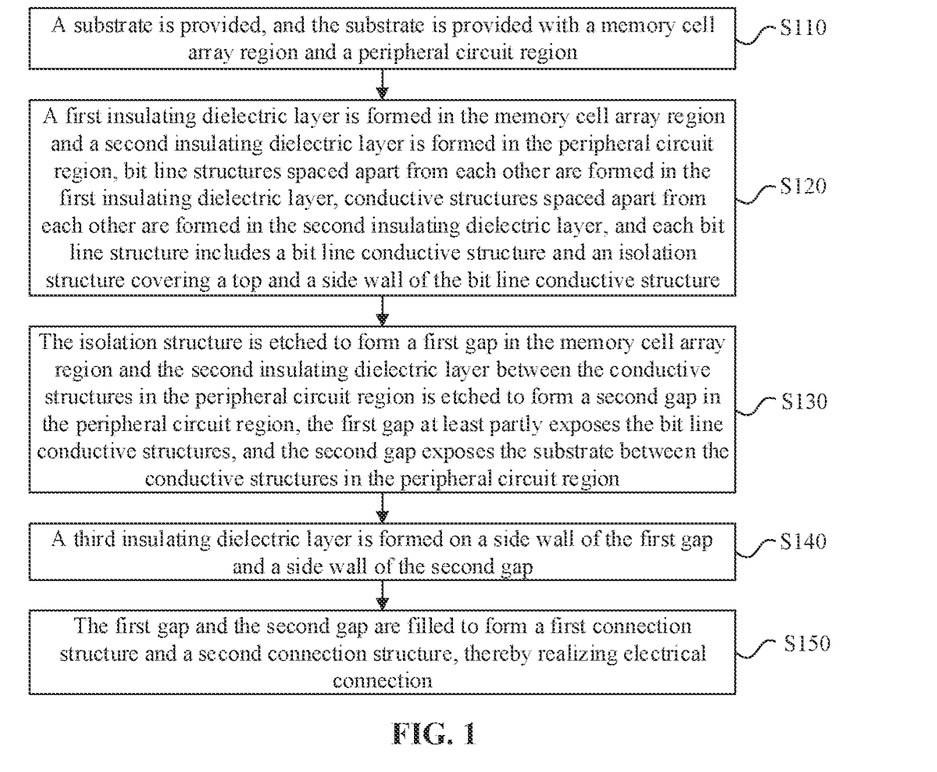
FIG. 1 is a flowchart of a method for manufacturing a semiconductor structure provided by the embodiments of the application.

Referring to FIG. 1, the embodiments of the application provide a method for manufacturing a semiconductor structure, which includes the following operations.

At S110, a substrate 100 is provided. The substrate 100 is provided with a memory cell array region (array) and a peripheral circuit region (periphery).

Figure 2:
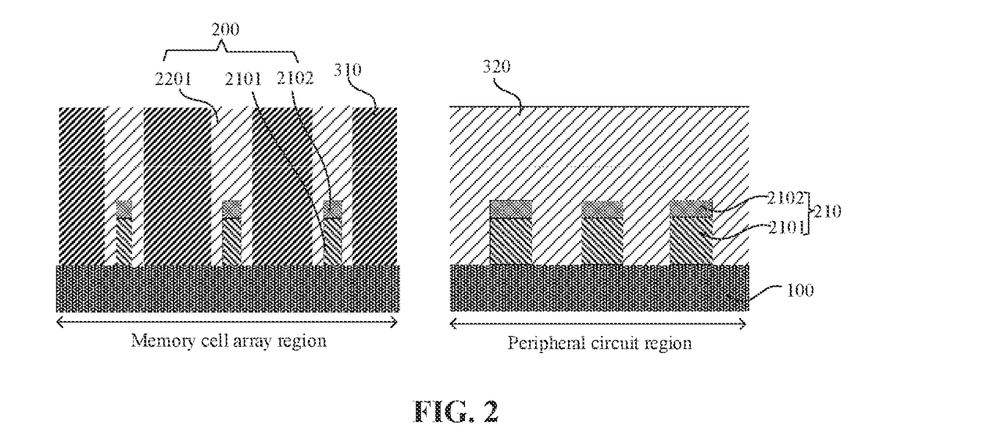
FIG. 2 to FIG. 6 are schematic diagrams of a gradually formed semiconductor structure provided by the embodiments of the application.

At S120, a first insulating dielectric layer 310 is formed in the memory cell array region and a second insulating dielectric layer 320 is formed in the peripheral circuit region. Bit line structures 200 spaced apart from each other are formed in the first insulating dielectric layer 310, and conductive structures 210 spaced apart from each other are formed in the second insulating dielectric layer 320. Each bit line structure 200 includes a bit line conductive structure 210 and a first bit line isolation structure 2201 covering a top and a side wall of the bit line conductive structure. The bit line conductive structure 210 may sequentially include a first conductive layer 2101 and a second conductive layer 2102 from bottom to top, as shown in FIG. 2.

Figure 3:
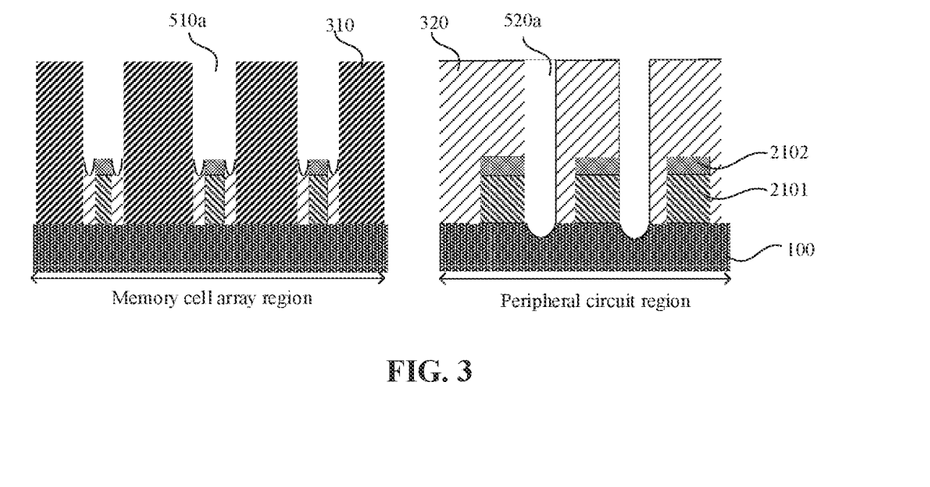

At S130, by taking the bit line conductive structure 210 as an etching stop layer, the first bit line isolation structure 2201 in the memory cell array region is etched to form a first gap 510a, where a part of a surface of the bit line conductive structure 210 is at least exposed through the first gap 510a; and the second insulating dielectric layer 320 in the peripheral circuit region is etched, to form a second gap 520a exposing the substrate 100 between the conductive structures 210 spaced apart from each other. Since the distance between the conductive structures 210 in the peripheral circuit region is getting smaller and smaller, at least one side wall of the conductive structure 210 may also be exposed during etching, as shown in FIG. 3.

Figure 4:
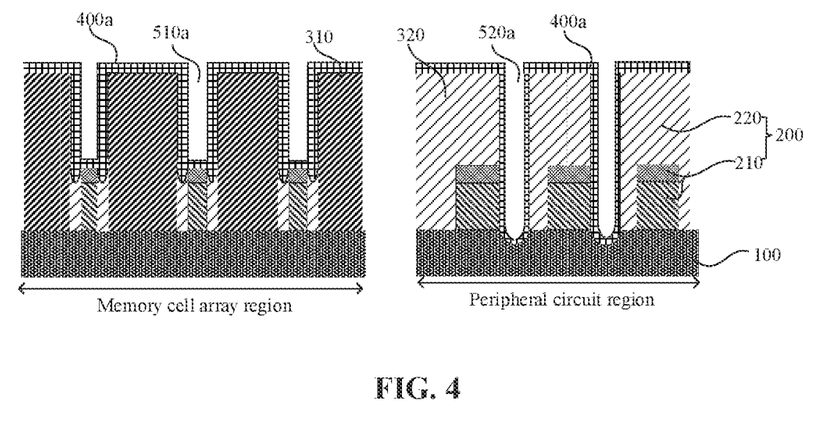
Figure 5:
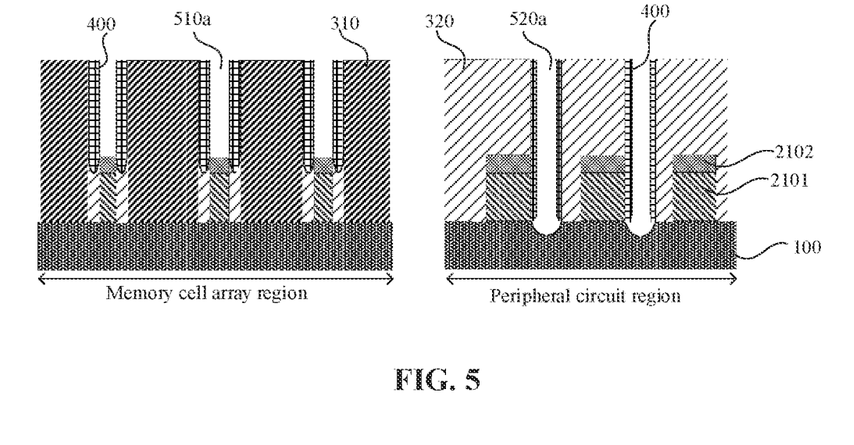

At S140, a third insulating dielectric layer 400 is formed, where the third insulating dielectric layer 400 covers a side wall of the first gap 510a and a side wall of the second gap 520a, as shown in FIG. 4 and FIG. 5.

Figure 6:
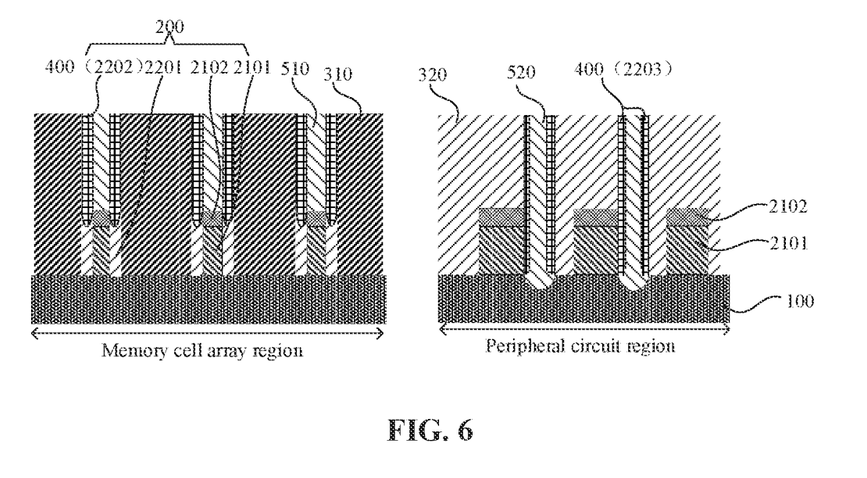

At S150, the first gap 510a and the second gap 520a are filled to form a first connection structure 510 and a second connection structure 520, thereby realizing electrical connection, as shown in FIG. 6.

It can be understood that, because an etching process is limited by an overlay error, a part of a side wall of the conductive structure 210 may be exposed or a part of the first bit line isolation structure 2201 may be damaged in a PC process. When the side wall of the conductive structure 210 in the peripheral circuit region is exposed, short-circuiting occurs between the second connection structure 520 and the conductive structure 210 in the peripheral circuit region. In order to solve the problem, in the embodiment, after the first gap 510a and the second gap 520a are formed through S110 to S130, the third insulating dielectric layer 400 covering the side wall of the first gap 510a and the side wall of the second gap 520a is formed, and a side wall of the conductive structure 210 is protected by the third insulating dielectric layer 400, so that the second connection structure 520 is isolated from the conductive structure 210, the second connection structure 520 in the peripheral circuit region and the conductive structure 210 in the peripheral circuit region are prevented from being short-circuited, and electric leakage contact between a capacitance contact hole conducting wire and the bit line conductive structure 210 in the memory cell array region is prevented in the memory cell array region. Moreover, a gap located between the bit line conductive structure 210 and the first insulating dielectric layer 310 and formed by partly etching the first bit line isolation structure 2201 is filled by the third insulating dielectric layer 400 so as to form a second bit line isolation structure 2202, the second bit line isolation structure 2202 and the first bit line isolation structure 2201 form a new bit line isolation structure 220, and repairing of a damaged bit line isolation structure in the PC process is achieved, so that the problem that the side wall of a bit line is damaged due to the PC process is solved, and the quality of the semiconductor structure is further improved.

In the embodiment, the substrate 100 includes a silicon base, an epitaxial silicon base, a silicon germanium base, a silicon carbide base or a silicon coated insulating base, but is not limited to this. Those skilled in the art may select the type of the semiconductor substrate according to a semiconductor device required to be formed on the substrate. Therefore, the type of the semiconductor substrate should not limit the scope of protection of the application. In the embodiment, the substrate 100 is a P type crystalline silicon substrate.

The substrate 100 includes a base and a shallow trench structure formed in the base, a plurality of active regions staggered in parallel are defined through the shallow trench structure, and the shallow trench structure is filled with an insulating material to form a shallow trench isolation structure. The substrate 100 may also include a word line structure and a bit line structure 200, the word line structure is an embedded word line structure, and an extension direction of the embedded word line structure intersects with an extension direction of the bit line structure 200. The bit line structure 200 includes a bit line conductive structure 210 and an isolation structure 220 covering a top and a side wall of the bit line conductive structure.

In an embodiment, the bit line conductive structure and the conductive structure are simultaneously formed. The operation that the bit line conductive structure and the conductive structure are formed includes the following operations.

A first conductive material layer is formed in the memory cell array region and the peripheral circuit region.

A second conductive material layer covering the first conductive material layer is formed.

The first conductive material layer and the second conductive material layer are etched to simultaneously form the bit line conductive structure in the memory cell array region and the conductive structure in the peripheral circuit region.

In the embodiment, the operation that the bit line structure 200 and the conductive structure 210 are formed includes the following operations.

In a first operation, an insulating material is simultaneously deposited in the memory cell array region and the peripheral circuit region of the substrate 100 by a deposition process, so as to form a spacer layer (not shown in the figure). The insulating material may be silicon oxide, silicon nitride, silicon oxynitride and the like, and the specific material may be selected according to process requirements. In the embodiment, the spacer layer is formed by adopting silicon nitride. Moreover, the deposition process may include Chemical Vapor Deposition (CVD), Low-Pressure Chemical Vapor Deposition (LPCVD), Plasma Enhanced Chemical Vapor Deposition (PECVD), Atomic Layer Deposition (ALD), Plasma Enhanced Atomic Layer Deposition (PEALD) and the like. In the embodiment, the spacer layer completely covers a surface of the substrate 100, and a top of the spacer layer is relatively flat.

In a second operation, a semiconductor conductive material, a metal material and an insulating material are sequentially deposited through the deposition process to respectively form the first conductive material layer, the second conductive material layer and the insulating material layer. In the embodiment, the first conductive material layer is manufactured by adopting polycrystalline silicon, low-temperature polycrystalline silicon and the like, the second conductive material layer is manufactured by adopting any one or any combination of titanium nitride, titanium, tungsten silicide and tungsten nitride, and the insulating material is manufactured by adopting the silicon nitride.

In a third operation, a first organic mask material layer and a first hard mask material layer are sequentially formed on the insulating material layer, and a layer of photoresist is coated on a surface of the first hard mask material layer to form a first photoresist layer. The material of the first hard mask material layer may be nitride, oxide, such as silicon oxynitride, silicon-carbon oxide and the like, and the material of the first organic mask material layer may be an antireflective material, an organic carbon material and the like. Afterwards, the first photoresist layer is subjected to exposure, cleaning and other operations to form a pattern defining the bit line structure 200 and the conductive structure 210. Then, the first photoresist layer is patterned as a mask, the first organic mask material layer and the first hard mask material layer are etched until the insulating material layer is exposed, a pattern is transferred to the first organic mask material layer and the first hard mask material layer, and the remaining first organic mask material layer and the remaining first hard mask material layer form a first hard mask layer. Finally, the photoresist layer is removed.

In a fourth operation, the first conductive material layer, the second conductive material layer and the insulating material layer are etched by taking the first hard mask layer as a mask, so that the bit line structure 200 and the conductive structure 210 are simultaneously formed.

After the bit line structure 200 is formed, in order to prevent electric leakage contact between the bit line conductive structure 210 and a subsequently formed capacitance contact hole conducting wire, a first bit line isolation structure 2201 covering a side wall of the bit line structure 200 is required to be formed. In an embodiment, the operation that the first bit line isolation structure 2201 is formed includes the following operations.

An isolation material layer is formed after the bit line structure 200 is formed, and the isolation material layer covers a side wall and a top of the bit line structure 200 and a surface of the substrate 100.

The isolation material layer is etched, so as to remove the isolation material layer on the surface of the substrate 100 and the top of the bit line structure 200, where the isolation material located on the side wall of the bit line structure 200 is retained to serve as the first bit line isolation structure 2201.

In the embodiment, the operation that the first bit line isolation structure 2201 is formed includes the following operation. An isolation material layer covering the surface of the bit line structure 200 and the surface of the substrate 100 is formed by depositing an insulating material. In the embodiment, the isolation material layer is manufactured by adopting silicon nitride. In another embodiment of the application, the material of the isolation material layer may be the same as the material of the insulating material layer located on the top of the bit line structure. Then, the isolation material layer is etched by an etching process, so as to remove the isolation material layer located on the top of the bit line structure 200 and the surface of the substrate 100. The isolation material layer located on the side wall of the bit line structure 200 and the insulating material layer located on the top of the bit line structure 200 are retained, and the insulating material layer on the top of the bit line structure 200 and the isolation material layer on the side wall of the bit line structure 200 serve as the first bit line isolation structure 2201.

After the first bit line isolation structure 2201 is formed, the first insulating dielectric layer 310 is formed in the memory cell array region generally by the deposition process and/or the etching/chemical mechanical grinding process. In an embodiment, the operation that the first insulating dielectric layer 310 is formed includes the following operations.

After the first bit line isolation structure 2201 is formed, a first insulating filler material layer is formed in the memory cell array region. The first insulating filler material layer fully fills the gap between the first bit line isolation structures 2201, and covers the top of the bit line structure 200.

The first insulating filler material layer is ground until the top of the bit line structure 200 is exposed, so that the first insulating dielectric layer 310 is formed.

After the conductive structure 210 in the peripheral circuit region is formed, a second insulating filler material layer is formed in the peripheral circuit region. The second insulating filler material layer fully fills the gap between the conductive structures 210, and covers the tops of the conductive structures 210, so that the second insulating dielectric layer 320 is formed.

In the embodiment, the first insulating dielectric layer 310 and the second insulating dielectric layer 320 are respectively formed. The specific operations are as follows.

After the first bit line isolation structure 2201 is formed, the memory cell array region is shielded, and a silicon nitride material is deposited in the peripheral circuit region to form the second insulating filler material layer in the peripheral circuit region. The second insulating filler material layer fully fills the gap between the conductive structures 210, and covers the tops of the conductive structures 210, as shown in the right portion of FIG. 2.

After the second insulating dielectric layer 320 is formed, the peripheral circuit region is shielded, and a first insulating filler material is deposited in the memory cell array region, so as to form the first insulating filler material layer. The first insulating filler material layer fully fills the gap between the bit line isolation structures 220, and covers the top of the bit line structure 200. Then, a part of the first insulating filler material layer is removed at a height by the etching process or the chemical mechanical grinding process until the top of the bit line structure 200 is exposed. The retained first insulating filler material layer serves as the first insulating dielectric layer 310, as shown in the left portion of FIG. 2.

It can be understood that, in some other embodiments, the first insulating dielectric layer 310 may be formed at first and then the second insulating dielectric layer 320 may be formed after the first bit line isolation structure 2201 in the memory cell array region is formed; or, when the first bit line isolation structure 2201 in the memory cell array region is formed, the second insulating dielectric layer 320 is simultaneously formed in the peripheral circuit region, and then the first insulating dielectric layer 310 is formed. The embodiment does not limit specific realization operations and modes of the first insulating dielectric layer and the second insulating dielectric layer.

After the bit line structure 200, the first bit line isolation structure 2201, the first insulating dielectric layer 310 and the second insulating dielectric layer 320 are formed, gaps are respectively formed in the peripheral circuit region and the memory cell array region by the etching process. In an embodiment, the operation that the first gap 510a is formed may include the following operations.

In the memory cell array region, by taking the bit line conductive structure 210 as an etching stop layer, the first bit line isolation structure 2201 is etched, so as to remove the first bit line isolation structure 2201 above a plane where the top of the bit line conductive structure 210 is located and a part of the first bit line isolation structure 2201 located on the side wall of the bit line conductive structure 210, so that the first gap 510a is formed.

It can be understood that, the first gap 510a and the second gap 520a are formed by one etching process in the embodiment, as long as a selection ratio of the second conductive material layer (namely tungsten) to silicon nitride is sufficiently large. Therefore, etching in the memory cell array region is basically stopped after the first gap 510a in the memory cell array region is manufactured, but etching in the peripheral circuit region will be continuously and downwardly carried out. When the surface of the contact is contacted, the depth may be fixed well, if etching is downwardly carried out according to pre-set time. The operation that the first gap 510a and the second gap 520a are formed may specifically include the following operations.

In a first operation, a second hard mask layer is formed on the first insulating dielectric layer 310 and the second insulating dielectric layer 320. The second hard mask layer is provided with a gap, and the first gap 510a and the second gap 520a may be defined through the gap. In the memory cell array region, the gap is located right above the first bit line isolation structure 2201. In the peripheral circuit region, the gap is located right above a region between two conductive structures 210.

In a second operation, by taking the second hard mask layer as a mask, the first bit line isolation structure 2201 located above the bit line conductive structure 210 and a part of the first bit line isolation structure 2201 located on the side wall of the bit line conductive structure 210 are removed in the memory cell array region by an etching ratio of silicon nitride to silicon oxide, so as to form the first gap 510a. The second insulating dielectric layer 320 between the two conductive structures 210 is removed in the peripheral circuit region, so as to form the second gap 520a. It can be understood that, under the limitation of the etching process, in order to completely expose the top of the bit line conductive structure 210 in the memory cell array region, a part of the first bit line isolation structure 2201 located between the bit line conductive structure 210 and the first insulating dielectric layer 310 may be etched away in the actual etching process, which results in that the bottom of the formed first gap 510a is W-shaped, as shown in the left portion of FIG. 3. Under the limitation of the overlay error, a part of the second insulating dielectric layer 320 and a part of the substrate 100 are etched away in the peripheral circuit region, so that a part of the side wall of the conductive structure 210 and the active region of the substrate are exposed, as shown in the right portion of FIG. 3.

In an embodiment, the first gap 510a is formed by an etching selection ratio of the first bit line isolation structure 2201 to the first insulating dielectric layer 310. In the embodiment, the first bit line isolation structure 2201 is manufactured by adopting silicon nitride, the first insulating dielectric layer 310 is manufactured by adopting silicon oxide, and the bit line conductive structure 210 and the conductive structure 210 are manufactured by adopting tungsten. By controlling an etching condition, a part of the first bit line isolation structure 2201 on the top and the side wall of the bit line conductive structure 210 is etched away and the etching is stopped above the bit line conductive structure 210, so as to form the first gap 510a, and meanwhile, the second gap 520a is formed in the peripheral circuit region.

Moreover, in the embodiment, the first bit line isolation structure 2201, the third insulating dielectric layer 400 and the second insulating dielectric layer 320 may be made of the same insulating material, such as silicon nitride. In another embodiment of the application, the first bit line isolation structure 2201, the third insulating dielectric layer 400 and the second insulating dielectric layer 320 are made of silicon nitride, and the first insulating dielectric layer 310 is made of silicon oxide.

It can be understood that, after the first bit line isolation structure 2201 between the bit line conductive structure 210 and the first insulating dielectric layer 310 is partly etched away, electrical leakage contact between the subsequently formed capacitance contact hole conducting wire and the bit line conductive structure 210 may be possibly caused. After a part of the second insulating dielectric layer 320 on the side wall of the conductive structure 210 in the peripheral circuit region is etched away, short-circuiting between the second connection structure 520 and the conductive structure 210 may be caused by direct contact therebetween. In order to solve the problem, in the embodiment, the conductive structure 210 in the peripheral circuit region is insulated and isolated from the second connection structure 520 by forming the third insulating dielectric layer 400.

In an embodiment, the operation that the third insulating dielectric layer 400 is formed may include the following operations.

A third insulating material layer 400a is formed. The third insulating material layer 400a covers surfaces of the first gap 510a and the second gap 520a and tops of the first insulating dielectric layer 310 and the second insulating dielectric layer 320.

The third insulating material layer 400a is etched, so as to remove the third insulating material layer 400a located on tops of the bit line structure 200, the substrate 100, the first insulating dielectric layer 310 and the second insulating dielectric layer 320, and retain the third insulating material layer 400a located on side walls of the first gap 510a and the second gap 520a to serve as the third insulating dielectric layer 400. The third insulating dielectric layer 400 on the side wall of the first gap 510a is the second bit line isolation structure 2202, which abuts against the first bit line isolation structure 2201, so as to isolate the bit line conductive structures 210 from each other.

In the embodiment, the specific process of forming the third insulating dielectric layer 400 by a silicon nitride material may include the following operations.

1) The silicon nitride material is deposited by a depositing process, so as to form a third insulating material layer 400a. The third insulating material layer 400a covers surfaces of the first gap 510a and the second gap 520a and tops of the first insulating dielectric layer 310 and the second insulating dielectric layer 320, referring to FIG. 4. The left portion of FIG. 4 illustrates a semiconductor structure in which the third insulating material layer 400a has been formed in the memory cell array region, and the right portion of FIG. 4 illustrates a semiconductor structure in which the third insulating material layer 400a has been formed in the peripheral circuit region. It can be understood that, the third insulating material layer 400a will cover the exposed side wall and top of the bit line conductive structure 210, and at least fill a part of a gap located between the conductive structure 210 and the second insulating dielectric layer 320.

2) The third insulating material layer 400a is etched by an etching process, so as to remove the third insulating material layer 400a located on a top surface of the bit line conductive structure 210, and tops of the substrate 100, the first insulating dielectric layer 310 and the second insulating dielectric layer 320. The retained the third insulating material layer 400a located on side walls of the first gap 510a and the second gap 520a serves as the third insulating dielectric layer 400, referring to FIG. 5. The left portion of FIG. 5 illustrates a semiconductor structure in which the third insulating dielectric layer 400 has been formed in the memory cell array region, and the right portion of FIG. 5 illustrates a semiconductor structure in which the third insulating dielectric layer 400 has been formed in the peripheral circuit region. In the sectional view as shown in the left portion of FIG. 5, the width of the third insulating dielectric layer 400 (namely the second bit line isolation structure 2202) in the memory cell array region and the width of the first bit line isolation structure 2201 may be the same or different from each other. In the embodiment, the width of the second bit line isolation structure 2202 is the same as the width of the first bit line isolation structure 2201, and the second bit line isolation structure 2202 is located above the first bit line isolation structure and abuts against the first bit line isolation structure.

In another embodiment of the application, after the third insulating dielectric layer 400 is formed in the first gap 510a and the second gap 520a, in order to remove the third insulating dielectric layer 400 formed on the top surface of the bit line conductive structure 210 and the third insulating dielectric layer 400 on the surface of the substrate in the peripheral circuit region, a very high selection ratio of silicon nitride, silicon oxide and tungsten is obtained by controlling an etching condition during dry etching, so that the third insulating dielectric layer 400 located on the top surface of the bit line conductive structure 210 and an active surface of the substrate in the peripheral circuit region is removed in a condition that the bit line conductive structure 210 and the active region on the substrate are not damaged, meanwhile, the third insulating dielectric layer 400 formed on the side wall of the first gap 510a is not damaged. Moreover, the thickness of the third insulating dielectric layer 400 retained on the side wall of the first gap 510a may also be adjusted by controlling an etching condition. For example, an etching selection ratio of silicon nitride, tungsten and silicon oxide is about 10:3:2 when etching is carried out by utilizing an etching gas containing difluoromethane, oxygen and argon.

In an embodiment, the thickness of the third insulating dielectric layer 400 on the side walls of the first gap 510a and the second gap 520a ranges from 2 nm to 4 nm.

It can be understood that, since the thickness the third insulating dielectric layer 400 ranges from 2 nm to 4 nm, an insulating and isolation effect on the bit line conductive structure/conductive structure 210 may be effectively achieved. Furthermore, the thickness of the third insulating dielectric layer 400 may also be controlled to be less than the thickness of the first bit line isolation structure, so that the space for the first connection structure 510 and the second connection structure 520 is prevented from being occupied due to large thickness, and thus the resistance of the first connection structure 510 and the second connection structure 520 is reduced. In another embodiment of the application, the thickness of the third insulating dielectric layer 400 may also be greater than the thickness of the first bit line isolation structure 2201, and preferably the thickness of the third insulating dielectric layer 400 may be 2.5 nm, 3.0 nm or 3.5 nm.

Referring to FIG. 6, after the third insulating dielectric layer 400 is formed, a metal material is deposited through the deposition process so as to form a connection material layer. The connection material layer covers tops of the third insulating dielectric layer 400, the first insulating dielectric layer 310 and the second insulating dielectric layer 320, and fully fills the first gap 510a and the second gap 520a. Afterwards, a part of the connection material layer is removed at a height by the etching process or the chemical mechanical process until the tops of the third insulating dielectric layer 400, the first insulating dielectric layer 310 and the second insulating dielectric layer 320 are exposed, so as to form the first connection structure 510 and the second connection structure 520.

The embodiments of the application further provide a semiconductor structure manufactured by the methods provided in any of the above embodiments, referring to FIG. 6. The semiconductor structure includes a substrate 100, a bit line structure 200 and a first insulating dielectric layer 310.

The substrate 100 is provided with a memory cell array region and a peripheral circuit region, and a first insulating dielectric layer 310 is formed on the substrate in the memory cell array region.

The bit line structure 200 is formed in the first insulating dielectric layer 310, and includes a bit line conductive structure and an isolation structure 220 located on a side wall of the bit line conductive structure. The bit line conductive structure includes a first conductive structure 210 and a second conductive structure 230 connected with a top of the first conductive structure. The isolation structure 220 includes a first bit line isolation structure 2201 and a second bit line isolation structure 2202 located above the first Bit line isolation structure 2201. The thickness of the first bit line isolation structure 2201 and the thickness of the second bit line isolation structure 2202 on the side wall of the bit line conductive structure 210 may be the same or different from each other.

In the embodiment, the semiconductor structure is provided through the methods provided in any of the above embodiments. Therefore, a damaged Bit line isolation structure in the PC process is repaired through the isolation structure 220, so that the problem that a side wall of a bit line is damaged due to the PC process at present is solved, and the quality of the semiconductor structure is further improved.

In an embodiment, the semiconductor structure also includes a peripheral circuit region, a second insulating dielectric layer 320, a conductive structure 210 and a third isolation structure 2203.

The peripheral circuit region is formed on the substrate 100, and the second insulating dielectric layer 320 is formed on the substrate in the peripheral circuit region. The conductive structure 210 is formed in the second insulating dielectric layer 320, the third isolation structure 2203 is also formed on the periphery of at least one side wall of the conductive structure, and the material of the third isolation structure and the material of the second isolation structure are the same. In the embodiment, the third isolation structure may include the third isolation structure in direct contact with the side wall of the conductive structure 210 and the third isolation structure deposited on the surface of the second insulating dielectric layer located on the side wall of the conductive structure.

In an embodiment, an interconnection structure is also included. The interconnection structure in the application is the second connection structure 520 formed above. The interconnection structure is formed in the second insulating dielectric layer 320, and is isolated from the conductive structure 210 through the third isolation structure 2203, so that the problem that the interconnection structure makes direct contact with the conductive structure 210 due to the fact that the second insulating dielectric layer 320 in the peripheral circuit region is etched to expose the surface of the conductive structure 210 may be avoided.

In an embodiment, a bottom of the interconnection structure further extends into the substrate, and is connected with an active region in the peripheral circuit region.

In conclusion, the embodiments of the application provide a semiconductor structure and a method for manufacturing a semiconductor structure. The method may include the following operations. A substrate is provided, where the substrate is provided with a memory cell array region and a peripheral circuit region. A first insulating dielectric layer is formed in the memory cell array region and a second insulating dielectric layer is formed in the peripheral circuit region. Bit line structures spaced apart from each other are formed in the first insulating dielectric layer, and conductive structures spaced apart from each other are formed in the second insulating dielectric layer. Each bit line structure includes a bit line conductive structure and an isolation structure covering a top and a side wall of the bit line conductive structure. The isolation structure is etched to form a first gap in the memory cell array region, and the second insulating dielectric layer between the conductive structures in the peripheral circuit region is etched to form a second gap in the peripheral circuit region. The first gap at least partly exposes the bit line conductive structures, and the second gap exposes the substrate between the conductive structures in the peripheral circuit region. A third insulating dielectric layer is formed on a side wall of the first gap and a side wall of the second gap. The thickness of the third insulating dielectric layer on the side wall of the first gap and the thickness of the isolation structure on the side wall of the bit line structure may be the same or different from each other. In the application, after the first gap and the second gap are formed, a third insulating dielectric layer covering side walls of the first gap and the second gap is formed. A side wall of the conductive structure is protected by the third insulating dielectric layer, so that the second connection structure is isolated from the conductive structure, the second connection structure in the peripheral circuit region and the conductive structure in the peripheral circuit region are prevented from being short-circuited, and electric leakage contact between a capacitance contact hole conducting wire and the bit line conductive structure in the memory cell array region is prevented in the memory cell array region. Moreover, a gap located between the bit line conductive structure and the first insulating dielectric layer and formed by partly etching the first bit line isolation structure is filled by the third insulating dielectric layer, so that repairing of a damaged Bit line isolation structure in the PC process is achieved, the problem that the side wall of a bit line is damaged due to the PC process is solved, and the quality of the semiconductor structure is further improved.

In description of the specification, description of reference terms such as "some embodiments", "other embodiments" and "ideal embodiments" refers to specific features, structures, materials or features described in combination with the embodiments or demonstrations included in at least one embodiment or demonstration of the application. In the specification, schematic description on the above terms not always refers to same embodiments or demonstrations.

Each technical feature of the above mentioned embodiments may be combined freely. For simplicity of description, not all possible combinations of each technical solution in the above mentioned embodiments are described. However, any combination of these technical features shall fall within the scope recorded in the specification without conflicting.

The above mentioned embodiments only express some implementation modes of the application and are specifically described in detail and not thus understood as limits to the patent scope of the application. It is to be pointed out that those of ordinary skill in the art may further make a plurality of transformations and improvements without departing from the concept of the application and all of these shall fall within the scope of protection of the application. Therefore, the scope of patent protection of the application should be subject to the appended claims.

The invention claimed is:

1. A method for manufacturing a semiconductor structure, comprising:
   providing a substrate, wherein the substrate is provided with a memory cell array region and a peripheral circuit region;
   forming a first insulating dielectric layer in the memory cell array region and forming a second insulating dielectric layer in the peripheral circuit region, wherein bit line structures spaced apart from each other are formed in the first insulating dielectric layer, conductive structures spaced apart from each other are formed in the second insulating dielectric layer, and each of the bit line structures comprises a bit line conductive structure and an isolation structure covering a top and a side wall of the bit line conductive structure;
   etching the isolation structure to form a first gap in the memory cell array region and etching the second insulating dielectric layer between the conductive structures in the peripheral circuit region to form a second gap in the peripheral circuit region, wherein the first gap at least partly exposes the bit line conductive structure, and the second gap exposes the substrate between the conductive structures in the peripheral circuit region; and
   forming a third insulating dielectric layer on a side wall of the first gap and a side wall of the second gap, wherein a thickness of the third insulating dielectric layer on the side wall of the first gap and a thickness of the isolation structure on a side wall of each of the bit line structures are the same or different from each other.

2. The method for manufacturing the semiconductor structure according to claim 1, wherein the second gap further extends into the substrate.

3. The method for manufacturing the semiconductor structure according to claim 1, wherein the first gap further extends to be between the side wall of the bit line conductive structure and the first insulating dielectric layer.

4. The method for manufacturing the semiconductor structure according to claim 1, further comprising simultaneously forming the bit line conductive structure and the conductive structures, wherein forming the bit line conductive structure and the conductive structures comprises:

forming a first conductive material layer in the memory cell array region and the peripheral circuit region;

forming a second conductive material layer covering the first conductive material layer; and etching the first conductive material layer and the second conductive material layer to simultaneously form the bit line conductive structure in the memory cell array region and the conductive structures in the peripheral circuit region.

5. The method for manufacturing the semiconductor structure according to claim 4, wherein the method further comprises forming the isolation structure, wherein forming the isolation structure comprises:

forming the second insulating dielectric layer on the second conductive material layer, and etching the first conductive material layer, the second conductive material layer and the second insulating dielectric layer in the memory cell array region to form the bit line structures and to retain the second insulating dielectric layer on an upper surface of each of the bit line structures; and forming the second insulating dielectric layer on the side wall of each of the bit line structures to form the isolation structure covering a top and the side wall of each of the bit line structures.

6. The method for manufacturing the semiconductor structure according to claim 1, further comprising:

forming a first connection structure in the first gap and forming a second connection structure in the second gap.

7. A semiconductor structure, comprising:

a substrate provided with a memory cell array region, wherein a first insulating dielectric layer is formed on the substrate in the memory cell array region;

a bit line structure, wherein the bit line structure is formed in the first insulating dielectric layer, and comprises a bit line conductive structure and an isolation structure located on a side wall of the bit line conductive structure, the bit line conductive structure comprises a first conductive structure and a second conductive structure connected with a top of the first conductive structure, the isolation structure comprises a first bit line isolation structure and a second bit line isolation structure located above the first bit line isolation structure, and a thickness of the first bit line isolation structure on the side wall of the bit line conductive structure and a thickness of the second bit line isolation structure on the side wall of the bit line conductive structure are the same or different from each other;

a peripheral circuit region formed on the substrate, wherein a second insulating dielectric layer is formed on the substrate in the peripheral circuit region;

a conductive structure formed in the second insulating dielectric layer; and a third isolation structure formed on a periphery of at least one side wall of the conductive structure, wherein a material of the third isolation structure and a material of the second bit line isolation structure are the same.

8. The semiconductor structure according to claim 7, further comprising an interconnection structure formed in the second insulating dielectric layer, wherein the interconnection structure is isolated from the conductive structure by the third isolation structure.

9. The semiconductor structure according to claim 8, wherein a bottom of the interconnection structure further extends into the substrate.

* * * * *